(12) United States Patent
Huang et al.

(10) Patent No.: US 8,003,510 B2
(45) Date of Patent: Aug. 23, 2011

(54) FABRICATION METHODS FOR NANO-SCALE CHALCOPYRITIC POWDERS AND POLYMERIC THIN-FILM SOLAR CELLS

(75) Inventors: Yu Huang, Hsinchu (TW); Bing-Joe Hwang, Taipei (TW); Hsuan-Fu Wang, Taipei (TW); Chih-Chung Wu, Taichung (TW); Shih-Hong Chang, Dali (TW)

(73) Assignee: Industrial Technology Research Institute, Hsinchu County (TW)

( * ) Notice: Subject to any disclaimer, the term of this patent is extended or adjusted under 35 U.S.C. 154(b) by 726 days.

(21) Appl. No.: 12/110,295

(22) Filed: Apr. 26, 2008

(65) Prior Publication Data

US 2009/0317939 A1    Dec. 24, 2009

(30) Foreign Application Priority Data

Dec. 20, 2007 (TW) .............................. 96148896 A

(51) Int. Cl.
*H01L 21/28* (2006.01)
*H01L 21/3205* (2006.01)
(52) U.S. Cl. ............... 438/602; 438/487; 257/E21.006; 257/21.007; 257/E21.077; 257/E21.126; 257/E21.127; 257/E21.129; 257/E21.134
(58) Field of Classification Search .................. 438/602, 438/603, 604, 608, 597, 509, 687, 487; 257/E21.006, E21.007, E21.077, E21.126, 257/E21.127, E21.129, E21.134
See application file for complete search history.

(56) References Cited

U.S. PATENT DOCUMENTS

2009/0317939 A1* 12/2009 Huang et al. .................... 438/82
2010/0133479 A1*  6/2010 Huang et al. ................ 252/501.1

FOREIGN PATENT DOCUMENTS

CN          1643702 A         7/2005

OTHER PUBLICATIONS

Li et al., Synthesis by a Solvothermal Route and Characterization of CuInSe2 Nanowhiskers and Nanoparticles, Adv. Mater. 1999, vol. 11, No. 17, 1456-1459, Wiley-VCH Verlag GmbH, Weinheim.
Staebler et al., Reversible conductivity changes in discharge-produced amorphous Si, Applied Physics Letters, vol. 31, No. 4, Aug. 15, 1977, 292-294, American Institute of Physics.
Ahn et al., Nucleation and growth of Cu(In,Ga)Se2 nanoparticles in low temperature colloidal process, Thin Solid Films, 515 (2007), 4036-4040, Elsevier B.V.
Ramanathan et al., Properties of 19.2% Efficiency ZnO/CdS/CuInGaSe2 Thin-film Solar Cells, Prog. Photovolt: Res. Appl. 2003; 11:225-230, John Wiley & Sons, Ltd.
Carmalt et al., Solid-state and solution phase metathetical synthesis of copper indium chalcogenides, J. Mater. Chem., 1998, 8(10), 2209-2211.
Grisaru et al., "Microwave-Assisted Polyol Synthesis of CuInTe2 and CuInSe2 Nanoparticles", Inorganic Chemistry, vol. 42, No. 22, 7148-7155, Sep. 30, 2003.

* cited by examiner

*Primary Examiner* — David Nhu
(74) *Attorney, Agent, or Firm* — Pai Patent & Trademark Law Firm; Chao-Chang David Pai

(57) ABSTRACT

Fabrication methods for nano-scale chalcopyritic powders and polymeric thin-film solar cells are presented. The fabrication method for nano-scale chalcopyritic powders includes providing a solution consisting of group IB, IIIA, VIA elements on the chemistry periodic table or combinations thereof. The solution is heated by a microwave generator. The solution is washed and filtered by a washing agent. The solution is subsequently dried, thereby acquiring nano-scale chalcopyritic powders.

21 Claims, 8 Drawing Sheets

| Element | Weight Percent | Atomic Percent |
|---|---|---|
| Cu | 22.72 | 29.33 |
| In | 29.67 | 21.20 |
| Se | 47.61 | 49.47 |
| Total | 100.00 | |

FIG. 3C

| Element | Weight Percent | Atomic Percent |
|---|---|---|
| Cu | 25.40 | 28.87 |
| Ga | 23.90 | 24.75 |
| Se | 50.71 | 46.38 |
| Total | 100.00 | |

FIG. 4C

FABRICATION METHODS FOR NANO-SCALE CHALCOPYRITIC POWDERS AND POLYMERIC THIN-FILM SOLAR CELLS

CROSS REFERENCE TO RELATED APPLICATIONS

This Application claims priority of Taiwan Patent Application No. 96148896, filed on Dec. 20, 2007, the entirety of which is incorporated by reference herein.

BACKGROUND OF THE INVENTION

1. Field of the Invention

The invention relates to fabrication methods for polynary chalcopyritic powders, and in particular to solvothermal synthesis methods for polynary chalcopyritic powders enhanced by microwave heating.

2. Description of the Related Art

Fabrication processes for forming a copper arsenide (indium) diselenide absorption thin film are chiefly divided into vacuum processes and non-vacuum processes. The vacuum processes include co-evaporation, and selenization, while the non-vacuum processes include spray pyrolysis, electro-deposition, and paste coating. With aspect to powder synthesis, high-energy mechanical alloying and solo-thermal methods are most popular.

The copper arsenide (indium) diselenide made from co-evaporation can be applied as an absorption layer of a thin-film solar cell reaching a maximum efficiency of approximately 19.5%. Cost of the co-evaporation equipment, however, is very expensive such that many research institutes are researching development of non-vacuum processes. Conventionally, the non-vacuum processes include thin film deposition and powder synthesis. Since the copper arsenide (indium) diselenide absorption layer is very sensitive to composition variations, thin film deposition of the copper arsenide (indium) diselenide is a great challenge. Thus, powder synthesis of the copper arsenide (indium) diselenide with a precisely controlled composition, is a mainstream non-vacuum process.

The main drawback of the conventional solution synthesis of the copper arsenide (indium) diselenide nano-scale powders is that it is time consuming. For example, Carmalt et al., discloses a method for synthesizing copper arsenide (indium) diselenide powders in 1998. Methylbenzene is applied as solvent, and solution consisting of copper chloride, indium chloride and sodium selenide is continuously heated 72 hours by refluxing. However, heating temperature has to reach 500° C. for a prolonged 24 hours to acquire a pure phase chalcopyritic structure. The equation for the chemical reaction is indicated as follows:

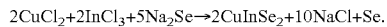

$2CuCl_2 + 2InCl_3 + 5Na_2Se \rightarrow 2CuInSe_2 + 10NaCl + Se.$

Other solution methods can achieve a fast reaction. For example, Kyung Hoon Yoon et al., discloses a method for synthesizing copper arsenide (indium) diselenide powders in 2006. Cuprous iodide (CuI), indium triiodide ($InI_3$), and gallium triiodide ($GaI_3$) are solved in pyridine by a gel process and reacted with sodium selenide (NaSe) which is solved in methanol. Copper arsenide (indium) diselenide powders, therefore, can be synthesized within a short period of time. The pyridine, however, is dangerously poisonous limiting applications thereto.

FIG. 1 is a flow chart illustration a conventional synthesized method for chalcopyritic structure powders by a solvothermal method. First, copper chloride ($CuCl_2 \cdot 2H_2O$), indium chloride ($InCl_3 \cdot 4H_2O$), and Se power with molar ratio 1:1:2 are solved in ethylenediamine and are positioned in a Teflon autoclave (step S10). Subsequently, the Teflon autoclave is put into an oven heated thereupon at 180° C. for a prolonged 15 hours (step S20). Next, the Teflon autoclave is cooled to room temperature, and the ethylenediamine solution is washed with D. I. water and ethanol and filtered for depositions. The abovementioned process is repeated several times to remove byproducts (step S30). The ethylenediamine solution is baked in a vacuum oven at 60° C. for a prolonged 4 hours to acquire pure phase nano-scale chalcopyritic powders (step S40).

One of the drawbacks for the conventional solvothermal method is that it is time consuming. Moreover, pure phase chalcopyritic powders are difficult to acquire. Accordingly, a synthesis method with a shortened process and high production efficiency is needed for those having ordinary skill in the art, to efficiently produce pure phase nano-scale chalcopyritic structure powders.

BRIEF SUMMARY OF THE INVENTION

The main features and key aspects of the invention are related to solvothermal synthesis methods for nano-scale chalcopyritic powders enhanced by microwave heating to improve purity of the nano-scale chalcopyritic powders. The reaction time is shortened and production cost is reduced. The nano-scale chalcopyritic powders are applicable to polymeric thin-film solar cells.

Embodiments of the invention provide a fabrication method for nano-scale chalcopyritic powders, comprising: providing a solution consisting of group IB, group IIIA, or group VIA elements on a chemistry periodic table or combinations thereof, heating the solution by a microwave generator; washing and filtering the solution by a washing agent; and baking the solution to acquire nano-scale chalcopyritic powders.

Embodiments of the invention also provide a fabrication method for polymeric thin-film solar cells, comprising: providing a solution consisting of group IB, group IIIA, or group VIA elements on a chemistry periodic table or combinations thereof; heating the solution by a microwave generator; washing and filtering the solution by a washing agent; baking the solution to acquire nano-scale chalcopyritic powders; directly blending the nano-scale chalcopyritic powders to create a thin film, or alternatively adding an adhesive and a dispersant thereafter to create a thin film; and adding a conductive polymer by blending or applying to create a p-n junction, thereby achieving the polymeric thin-film solar cell.

BRIEF DESCRIPTION OF THE DRAWINGS

The invention can be more fully understood by reading the subsequent detailed description and examples with references made to the accompanying drawings, wherein:

FIG. 3C is a table list depicting each element content according to an X-ray energy dispersive spectra (EDS) analysis of the CuInSe$_2$ powders in FIG. 3B;

FIG. 4C is a table list depicting each element content according to an X-ray energy dispersive spectra (EDS) analysis of the CuGaSe$_2$ powders in FIG. 4B.

DETAILED DESCRIPTION OF THE INVENTION

Figure 1:
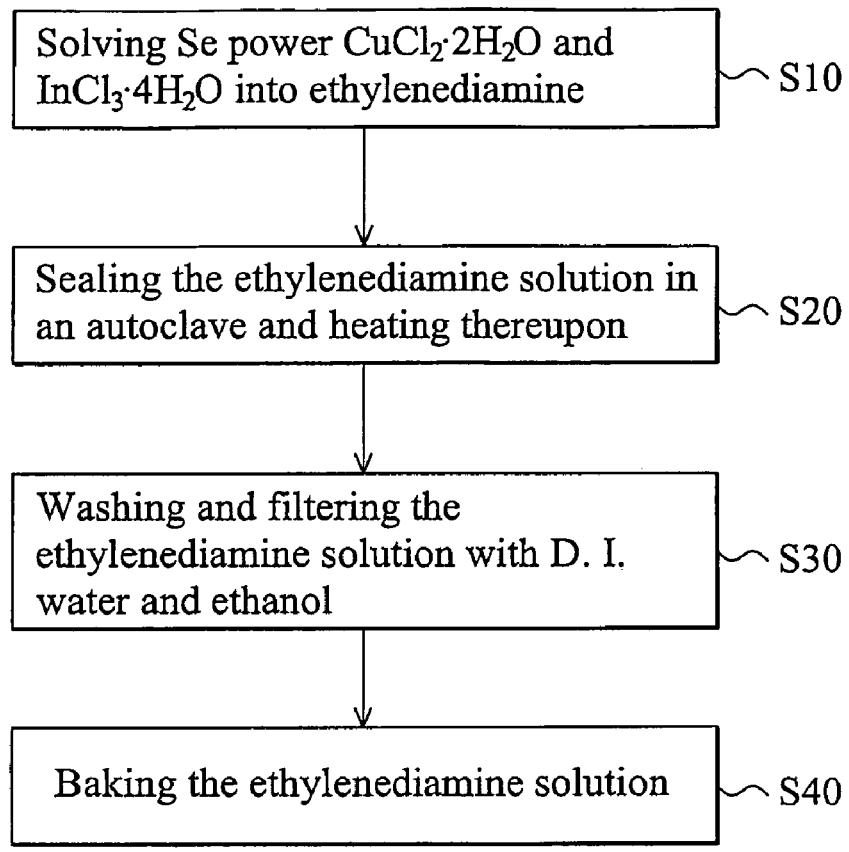
FIG. 1 is a flow chart illustration a conventional synthesized method for chalcopyritic structure powders by a solvothermal method.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

In order to solve the time consuming issues of the conventional solvothermal synthesis methods for nano-scale chalcopyritic powders, embodiments of the invention provides microwave enhanced heating to shorten solvothermal reaction time to synthesis copper indium diselenide, copper arsenide diselenide, and copper arsenide indium diselenide nano-scale powders.

For synthesizing copper indium diselenide (CuInSe$_2$) by a solvothermal method, Se power, indium chloride (InCl$_3$.4H$_2$O), and copper chloride (CuCl$_2$.2H$_2$O), are mixed and added organic amine (e.g., ethylenediamine) as chelating agents. The chelating agents can create polydentate ligands of coordinate covalent bonds with metal elements. The solvents used provide function of coordination. In addition to providing chelating capability with metal compounds, the chelating agents can also absorb abundant heat released during synthesis reaction and can enhance solvability of precursor salt in solvents, thus improving full reaction. The reactive mechanism for the abovementioned is indicated as follows:

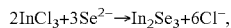

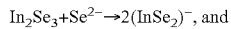

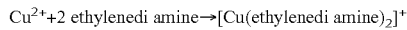

wherein the total reaction can be expressed as:

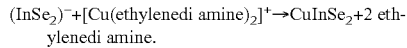

Meanwhile, the polydentate ligands of coordinate covalent bonds structure [Cu(ethylenediamine)$_2$]$^+$ formed by amine salt and copper ions can be expressed as:

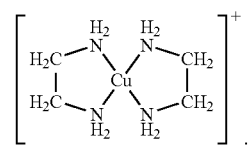

Figure 2:
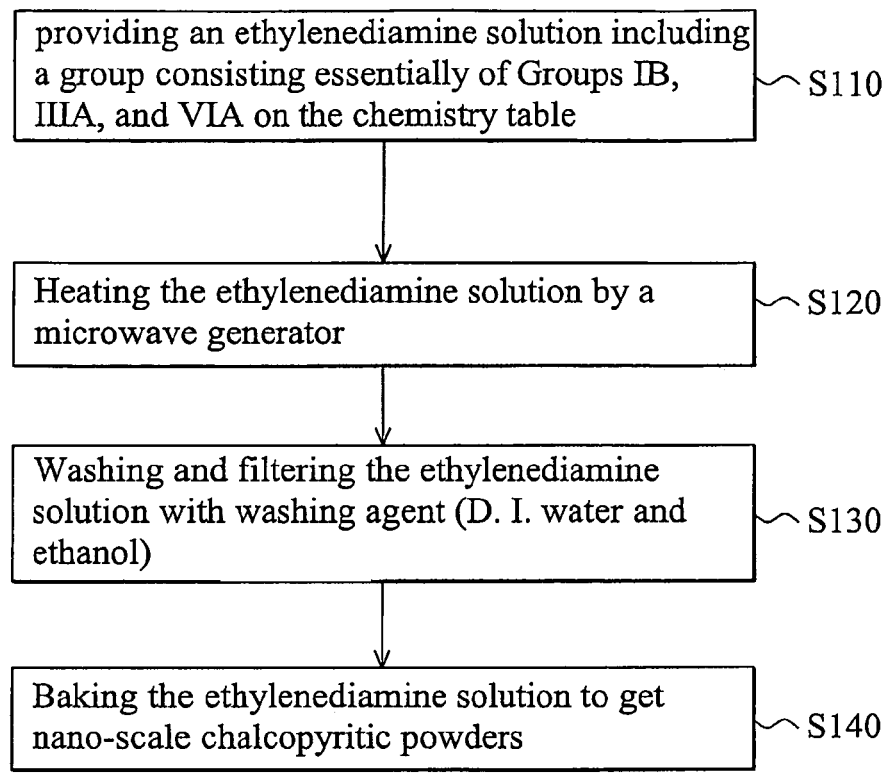
FIG. 2 is a flow chart illustration an embodiment of a synthesis method for chalcopyritic structure powders by a microwave enhanced solvothermal method of the invention.

FIG. 2 is a flow chart illustration an embodiment of a synthesis method for chalcopyritic structure powders by a microwave enhanced solvothermal method of the invention. First, an ethylenediamine solution including a group consisting essentially of Groups IB, IIIA, and VIA on the chemistry table is provided (Step S110). For example, copper chloride (CuCl$_2$.2H$_2$O), indium chloride (InCl$_3$.4H$_2$O)/gallium chloride (GaCl$_3$.4H$_2$O), and Se powers (or sulfur powders) with molar ratio Cu:In/Ga:Se=1:1:2 are mixed with a desired synthesized compound in a molar range approximately between 1 μmole and 1 Mmole, preferably between 1 mmole and 1 mole. Subsequently, Se powers (or sulfur powders), indium chloride (InCl$_3$.4H$_2$O)/gallium chloride (GaCl$_3$.4H$_2$O), and copper chloride (CuCl$_2$.2H$_2$O) are sequentially solved in anhydrous ethylenediamine and are positioned in a container with volume in a range approximately between 1 ml and 1000 l, preferably between 1 ml and 100 ml.

Next, a magnetic is put into the anhydrous ethylenediamine solution and uniformly agitated by a magnetic stirrer driver. The agitation period is approximately between 1 minute and 1000 hours, preferably between 10 minutes and 10 hours. After uniform agitation, the container is tightly locked in a microwave reactor.

Next, the ethylenediamine solution is heated by a microwave generator (step S120). For example, the output power of the microwave reactor is set in a range approximately between 10 watts and 500 watts, the temperature is set at approximately between 10° C. and 500° C., preferably between 100° C. and 500° C., the heating period is prolonged to approximately between 1 minute and 10 hours, preferably between 10 minutes to 5 hours.

After the reaction is completed, the ethylenediamine solution is washed and filtered with a washing agent (e.g., D. I. water and ethanol) (step S130). For example, the molten reactants are drawn out and put into a funnel. Phase separation is performed by ethanol.

Next, the ethylenediamine solution is dried to result in nano-scale chalcopyritic powders (step S140). For example, the separated depositions is put into a vacuum high temperature oven and dried. The temperature is set at in a range approximately between 30° C. and 100° C., preferably between 60° C. and 80° C. The heating period is prolonged to between 3 hours and 8 hours to acquire pure phase nano-scale CuIn(Ga)Se$_2$ ternary (quadruple) compound powders.

Figure 3A:
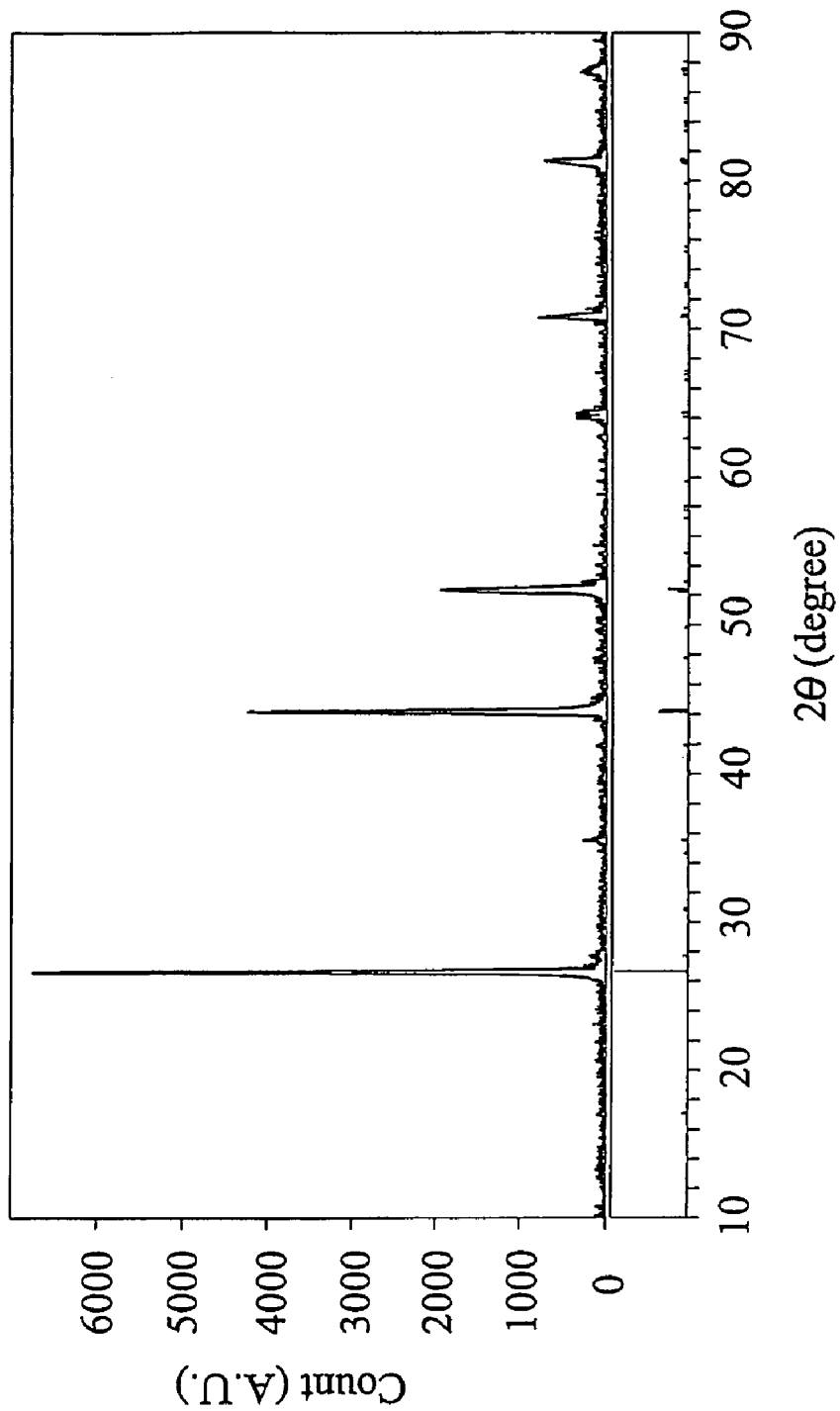
FIG. 3A is an X-ray diffraction spectrum of $CuInSe_2$ powders synthesized according to an embodiment of the invention.
Figure 3B:
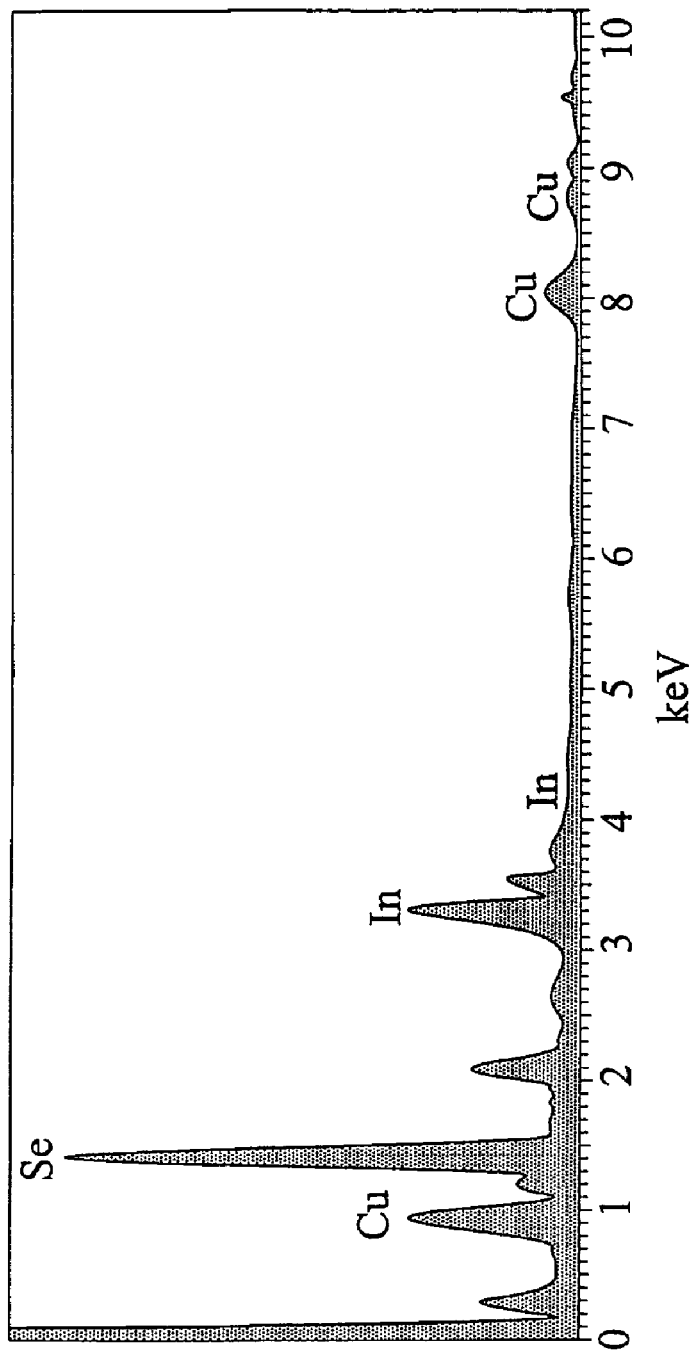
FIG. 3B is an SEM X-ray energy dispersive spectra (EDS) analysis of the $CuInSe_2$ powders.

FIG. 3A is an X-ray diffraction spectrum of CuInSe$_2$ powders synthesized according to an embodiment of the invention. FIG. 3B is an SEM X-ray energy dispersive spectra (EDS) analysis of the CuInSe$_2$ powders. FIG. 3C is a table list depicting each element content according to an X-ray energy dispersive spectra (EDS) analysis of the CuInSe$_2$ powders in FIG. 3B.

Referring to FIG. 3A, in one embodiment of the invention, the copper indium diselenide (CuInSe$_2$) powder synthesized by the microwave enhanced solvothermal method was analyzed by a powder X-ray diffraction meter and compared with the joint committee on powder diffraction standard (JCPDS) card No. 65-4869, to ensure that the copper indium diselenide (CuInSe$_2$) powder was a pure phase chalcopyritic structure. The main peaks corresponded to crystallographic (112), (220)/(204), (116)/(312) planes without other intermediate phases. The full width at half maximum (FWHM) was calculated and replaced in a Scherrer's equation resulting in average diameters of the $CuInSe_2$ powder to be approximately 49.1 nm. Referring to FIG. 3B and FIG. 3C, each element ratio was analyzed by an EDX resulting in a ratio of the Cu:In:Se=1:1:2, which matched theoretical expectations, as listed in FIG. 3C. Therefore, nano-scale chalcopyritic copper indium diselenide ($CuInSe_2$) powders can be synthesized with shortened reaction period according to embodiments of the invention.

Figure 4A:
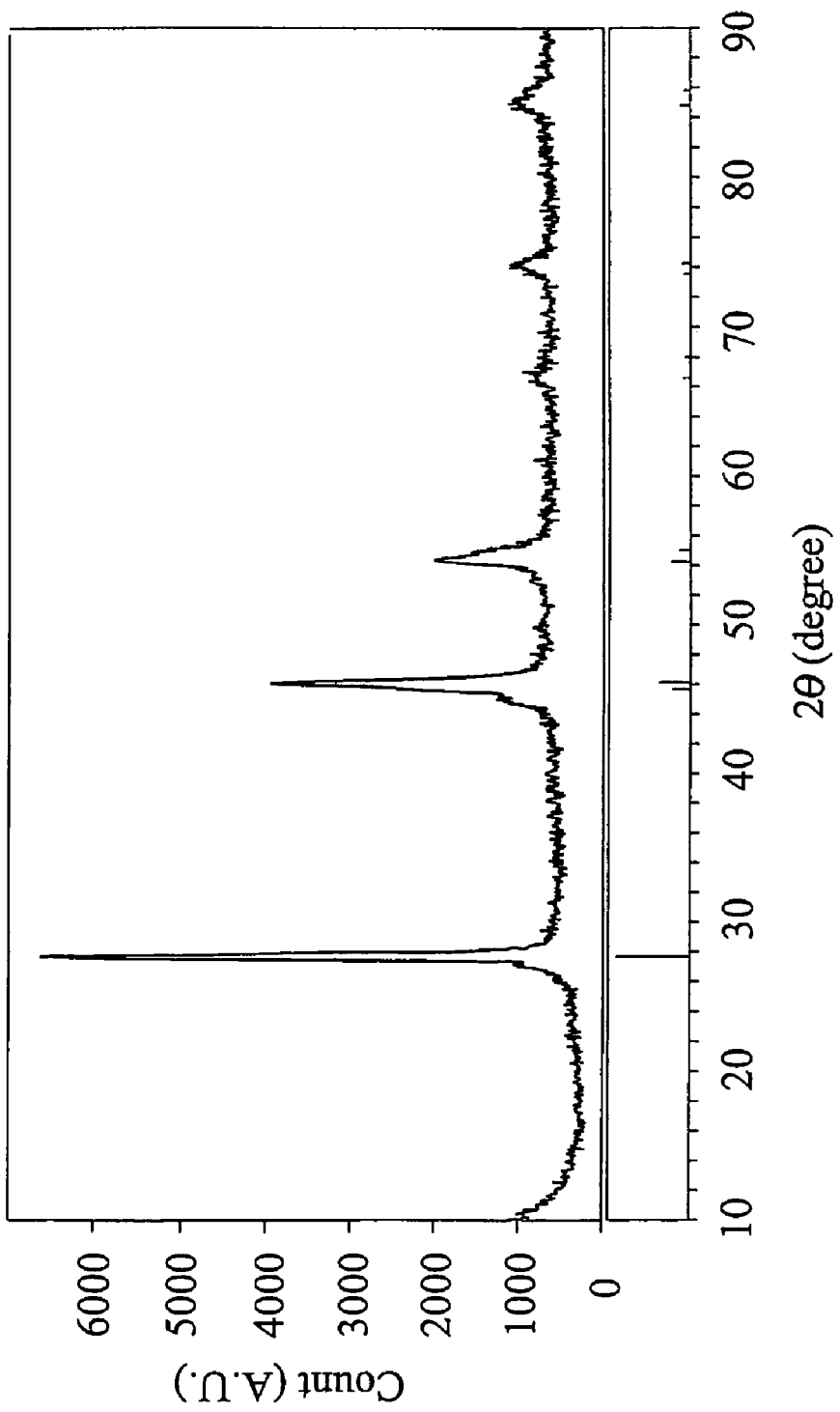
FIG. 4A is an X-ray diffraction spectrum of CuGaSe$_2$ powders synthesized according to another embodiment of the invention.
Figure 4B:
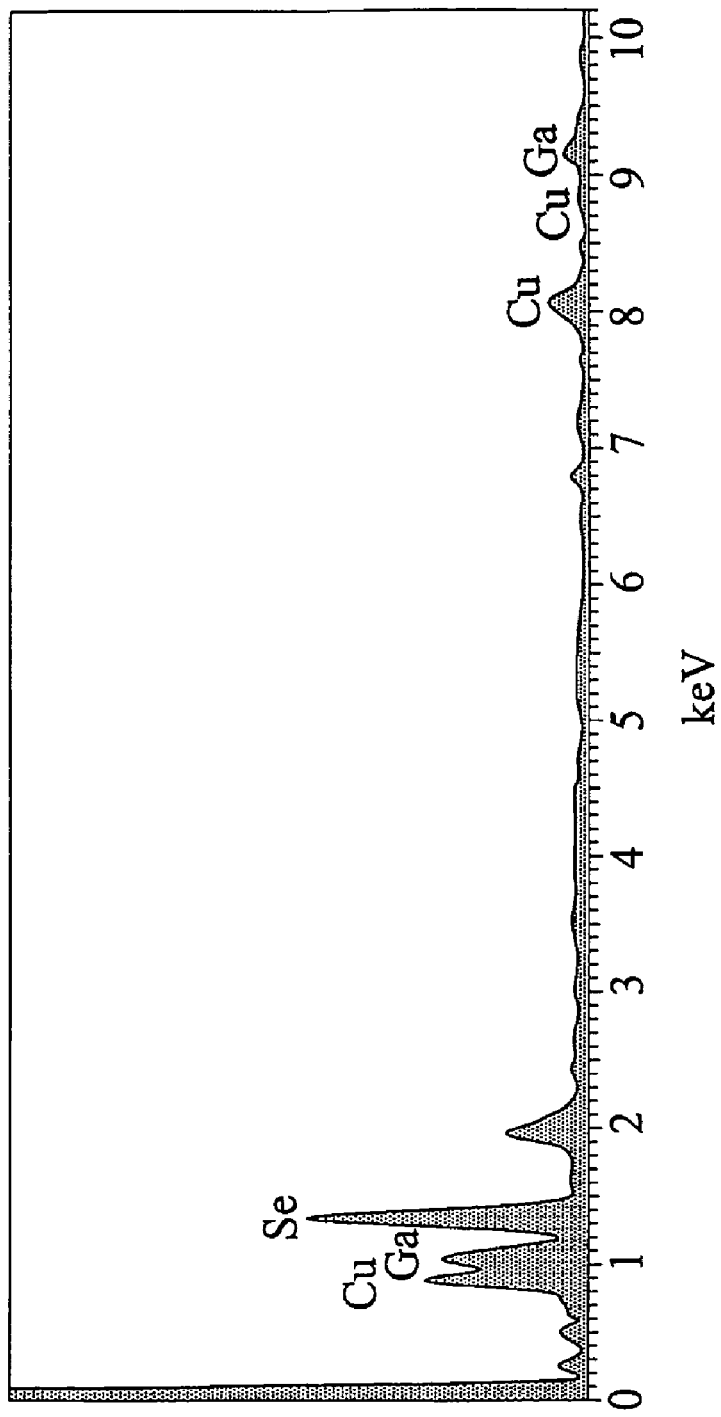
FIG. 4B is an SEM X-ray energy dispersive spectra (EDS) analysis of the CuGaSe$_2$ powders.

FIG. 4A is an X-ray diffraction spectrum of $CuGaSe_2$ powders synthesized according to another embodiment of the invention. FIG. 4B is an SEM X-ray energy dispersive spectra (EDS) analysis of the $CuGaSe_2$ powders. FIG. 4C is a table list depicting each element content according to an X-ray energy dispersive spectra (EDS) analysis of the $CuGaSe_2$ powders in FIG. 4B.

Referring to FIG. 4A, in another embodiment of the invention, the copper gallium diselenide ($CuGaSe_2$) powder synthesized by a microwave enhanced solvothermal method was analyzed by a powder X-ray diffraction meter and compared with the JCPDS card No. 31-0456, to ensure that the copper gallium diselenide ($CuGaSe_2$) powder was a pure phase chalcopyritic structure. The main peaks corresponded to crystallographic (112), (220)/(204), (116)/(312) planes without other intermediate phases. The full width at half maximum (FWHM) was calculated and replaced in a Scherrer's equation resulting in average diameters of the $CuGaSe_2$ powder to be approximately 21.4 nm. Each element ratio was analyzed by an EDX resulting in the ratio of Cu:Ga:Se=1:1:2, which matched theoretical expectations, as listed in FIG. 4C. Therefore, nano-scale chalcopyritic copper gallium diselenide ($CuGaSe_2$) powders can be synthesized with shortened reaction period according to embodiments of the invention.

Note that although the invention is described using copper indium diselenide and copper gallium diselenide as exemplary embodiments, it is not limited thereto. Anyone with ordinary skill in the art will appreciate that other chalcopyritic structures including a group consisting essentially of Groups IB, IIIA, and VIA on the chemistry table are equally suitable to achieve the desired processing results.

According to another aspect of the invention, the chalcopyritic structure powders synthesized by a microwave enhanced solvothermal method can be further applicable to fabricating polymeric thin-film solar cells. For example, the nano-scale chalcopyritic powders are directly blended to create a thin film or alternatively added an adhesive and a dispersant thereafter, to create a thin film. Subsequently, a conductive polymer is added by blending or applying to create a p-n junction, thereby achieving the polymeric thin-film solar cell. The conductive polymer comprises poly(3,4-ethylenedioxythiophene) (PEDOT), polythiophene, polypyrrole, or polyaniline. Alternatively, in another embodiment, the chalcopyritic structure powders can be further compressed in a high purity target for a vacuum thin film deposition processes.

The embodiments of the invention is advantageous in that microwave heating can effectively and efficiently reduce reaction time of solvothermal synthesis of the chalcopyritic structure powders. Since microwave heating transfers and provides thermal energy to substances via electromagnetic field which can rapidly penetrate substances and reduce thermal gradients, both reaction time and energy consumption are desirably reduced. Additionally, most polar compounds can consequently rotate due to induction by microwave electromagnetic field, and ions solved in the solution can simultaneously migrate with high speed vibration induced by microwave electromagnetic field. Thus, reaction is accelerated due to the collision probability increment between the adjacent molecules.

While the invention has been described by way of example and in terms of the several embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for nano-scale chalcopyritic powders, the fabrication method comprising:
    providing a solution comprising group IB, group IIIA, or group VIA elements on a chemistry periodic table or combinations thereof;
    heating the solution by a microwave generator;
    washing and filtering the solution by a washing agent; and
    baking the solution to acquire the nano-scale chalcopyritic powders.

2. The fabrication method as claimed in claim 1, wherein a solvent of the solution comprises water, alcohol, benzene, amine, pyridine, tri-n-octyl phosphide, other organic or inorganic solutions.

3. The fabrication method as claimed in claim 1, wherein the group IB elements comprise copper.

4. The fabrication method as claimed in claim 1, wherein the group IIIA elements comprise arsenic and indium.

5. The fabrication method as claimed in claim 1, wherein the group VIA elements comprise selenium and sulfur.

6. The fabrication method as claimed in claim 1, wherein an output power of the microwave generator is approximately in a range between 1 W to 3000 W.

7. The fabrication method as claimed in claim 1, wherein a heating temperature by the microwave generator is approximately in a range between 10° C. and 500° C.

8. The fabrication method as claimed in claim 1, wherein a heating period by the microwave generator is approximately in a range between 1 min and 10 hours.

9. The fabrication method as claimed in claim 1, wherein the washing agent comprises deionized water and ethanol.

10. The fabrication method as claimed in claim 1, wherein baking the solution is performed in a high temperature vacuum oven, with a heating temperature in a range between about 30° C. and 100° C., and with a heating period in a range between about 1 hour and 100 hours.

11. A fabrication method for polymeric thin-film solar cells, the fabrication method comprising:
    providing a solution comprising group IB, group IIIA, or group VIA elements on a chemistry periodic table or combinations thereof;
    heating the solution by a microwave generator;
    washing and filtering the solution by a washing agent;
    baking the solution to acquire nano-scale chalcopyritic powders;
    directly blending the nano-scale chalcopyritic powders to create a thin film, or alternatively adding an adhesive and a dispersant thereafter to create a thin film; and
    adding a conductive polymer by blending or applying to create a p-n junction, thereby achieving the polymeric thin-film solar cells.

12. The fabrication method as claimed in claim 11, wherein a solvent of the solution comprises water, alcohol, benzene, amine, pyridine, tri-n-octyl phosphide, other organic or inorganic solutions.

13. The fabrication method as claimed in claim 11, wherein the group IB elements comprise copper.

14. The fabrication method as claimed in claim 11, wherein the group IIIA elements comprise arsenic and indium.

15. The fabrication method as claimed in claim 11, wherein the group VIA elements comprise selenium and sulfur.

16. The fabrication method as claimed in claim 11, wherein an output power of the microwave generator is approximately in a range between 1 W to 3000 W.

17. The fabrication method as claimed in claim 11, wherein a heating temperature by the microwave generator is approximately in a range between 10° C. and 500° C.

18. The fabrication method as claimed in claim 11, wherein a heating period by the microwave generator is approximately in a range between 1 min and 10 hours.

19. The fabrication method as claimed in claim 11, wherein the washing agent comprises deionized water and ethanol.

20. The fabrication method as claimed in claim 11, wherein baking the solution is performed in a high temperature vacuum oven, with a heating temperature in a range between about 30° C. and 100° C., and with a heating period in a range between about 1 hour and 100 hours.

21. The fabrication method as claimed in claim 11, wherein the conductive polymer comprises poly(3,4-ethylenedioxythiophene) (PEDOT), polythiophene, polypyrrole, or polyaniline.

\* \* \* \* \*